(12) United States Patent
Ge (10) Patent No.: US 10,609,834 B2
(45) Date of Patent: Mar. 31, 2020

(54) CONNECTION PLATE ASSEMBLY AND DISPLAY DEVICE

(71) Applicant: BOE TECHNOLOGY GROUP CO., LTD., Beijing (CN)

(72) Inventor: Xu Ge, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 21 days.

(21) Appl. No.: 15/927,142

(22) Filed: Mar. 21, 2018

(65) Prior Publication Data

US 2019/0069428 A1  Feb. 28, 2019

(30) Foreign Application Priority Data

Aug. 28, 2017  (CN) .................... 2017 2 1081233 U (51) Int. Cl.
*H05K 7/14* (2006.01)
*G02F 1/01* (2006.01)

(52) U.S. Cl.
CPC ......... *H05K 7/1401* (2013.01); *G02F 1/0102* (2013.01); *H05K 7/1417* (2013.01); *G02F 2201/50* (2013.01)

(58) Field of Classification Search
CPC .. H05K 7/1401; H05K 7/1417; G02F 1/0102; G02F 2201/50; G06F 1/1607; G06F 1/1611; G06F 1/1609; F16M 13/02
See application file for complete search history.

(56) References Cited

U.S. PATENT DOCUMENTS

| | | | | |
|---|---|---|---|---|
| 5,074,512 A | * | 12/1991 | Gianforcaro, II | ........ B41J 29/15 248/279.1 |
| 5,125,612 A | * | 6/1992 | McNeal | ............... A47B 21/045 248/442.2 |
| 5,806,693 A | * | 9/1998 | Carbonaro | ........... A47B 21/045 211/169 |
| 6,550,737 B1 | * | 4/2003 | Sai | ......................... F16M 13/02 211/69.1 |
| 6,967,632 B1 | * | 11/2005 | Minami | ................. F16M 11/08 345/1.3 |
| 7,296,696 B2 | * | 11/2007 | Brennan | ............... G06F 1/1607 211/10 |
| 7,681,856 B1 | * | 3/2010 | Thomas | ............... A47B 21/045 248/442.2 |
| 2007/0022583 A1 | * | 2/2007 | Carnevali | ................. A45F 5/00 24/523 |
| 2009/0008349 A1 | * | 1/2009 | Kim | ...................... G06F 1/1607 211/150 |

(Continued)

FOREIGN PATENT DOCUMENTS

CN  104898789 A  9/2015

OTHER PUBLICATIONS

Second Office Action for Chinese Application No. 201721081233.4, dated May 2, 2018, 2 Pages.

*Primary Examiner* — Daniel P Wicklund
*Assistant Examiner* — Christopher L Augustin
(74) *Attorney, Agent, or Firm* — Brooks Kushman P.C.

(57) ABSTRACT

A connection plate assembly includes at least one connection plate and a clamp. The clamp is to detachably attach the connection plate to a lateral side of a display device except for a light emitting side of the display device. A display device with the connection plate assembly is also provided.

11 Claims, 5 Drawing Sheets

(56) References Cited

U.S. PATENT DOCUMENTS

| | | | |
|---|---|---|---|
| 2010/0224741 A1* | 9/2010 | Liao | F16M 11/041 248/125.1 |
| 2011/0062299 A1* | 3/2011 | Tsai | F16M 11/041 248/231.41 |
| 2013/0200228 A1* | 8/2013 | Costas | G06F 1/1611 248/205.1 |
| 2015/0138711 A1* | 5/2015 | Relf | G06F 1/1647 361/679.26 |
| 2016/0273703 A1* | 9/2016 | Li | A45F 5/00 |
| 2017/0006726 A1* | 1/2017 | Li | H05K 7/1404 |
| 2017/0009935 A1* | 1/2017 | Theis | F16M 11/041 |
| 2017/0265313 A1* | 9/2017 | Deng | F16B 2/12 |
| 2017/0277224 A1* | 9/2017 | Mizushi | G06F 1/1607 |
| 2018/0008044 A1* | 1/2018 | Holt | A47B 97/00 |
| 2018/0010622 A1* | 1/2018 | Wu | F16B 2/10 |

* cited by examiner

CONNECTION PLATE ASSEMBLY AND DISPLAY DEVICE

CROSS-REFERENCE TO RELATED APPLICATION

This application claims priority to Chinese Patent Application No. 201721081233.4 filed on Aug. 28, 2017, which is incorporated herein by reference in its entirety.

TECHNICAL FIELD

The present disclosure relates to the field of manufacture of liquid crystal products, and in particular to a connection plate assembly and a display device.

BACKGROUND

Currently, there is not a mature product in the market that can solve problems of requiring large space at one side of a display screen for temporarily placing things, pasting labels or recording temporary information.

SUMMARY

According to a first aspect of the present disclosure, a connection plate assembly is provided and includes at least one connection plate and a clamp. The clamp is configured to detachably attach the connection plate to a lateral side of a display device except for a light emitting side of the display device.

Optionally, the display device has a first lateral side, a second lateral side and a third lateral side; the first lateral side and the third lateral side are two opposite lateral sides of the display device; the second lateral side is adjacent to both of the first lateral side and the third lateral side. The clamp includes a clamping member configured to clamp the first lateral side and the third lateral side; the clamping member includes a first clamping portion and a second clamping portion, and the first clamping portion and the second clamping portion are at two opposite sides of the clamping member. The first clamping portion and the second clamping portion are configured to, when the clamping member clamps the display device, the first clamping portion is in contact with the first lateral side and the second clamping portion is in contact with the third lateral side, so that the at least one connection plate is located at the second lateral side.

Optionally, a first elastic protection portion is disposed at one side of the first clamping portion facing the second clamping portion, and a second elastic protection portion is disposed at one side of the second clamping portion facing the first clamping portion.

Optionally, a first elastic protection structure is sleeved on the first clamping portion, and one part of the first elastic protection structure at one side of the first clamping portion facing the second clamping portion forms the first elastic protection portion; a second elastic protection structure is sleeved on the second clamping portion, and one part of the second elastic protection structure at one side of the second clamping portion facing the first clamping portion forms the second elastic protection portion.

Optionally, a groove is defined in one surface of the first elastic protection portion facing the second elastic protection portion; and a groove is defined in one surface of the second elastic protection portion facing the first elastic protection portion.

Optionally, the first elastic protection portion and the second elastic protection portion are made of rubber.

Optionally, the clamping member further includes an adjustment member configured to adjust a distance between the first clamping portion and the second clamping portion.

Optionally, the adjustment member includes a tube and a spring within the tube; and two ends of the spring are connected with the first clamping portion and the second clamping portion, respectively.

Optionally, the clamp further includes at least one connection rod that is connected with the clamping member, and each connection rod is mounted with at least one connection plate.

Optionally, the connection rod is substantially horizontally disposed, and the connection rod is configured to rotate around the clamping member in the horizontal plane.

Optionally, the connection plate is rotatable connected to the connection rod by a U-shaped connector; the connection rod extends through the U-shaped connector; a fixing portion is provided at each of two ends of the U-shaped connector; a through hole is defined through each of the fixing portions for mounting a screw or an adhesive layer is at each of the fixing portions.

Optionally, an adjustment piece is on an end of the connection rod away from the clamping member, and the adjustment piece is configured to adjust a rotation angle of the connection plate.

Optionally, an external thread is provided at an outer circumferential surface of the end of the connection rod away from the clamping member, and the adjustment piece is an adjustment screw that engages with the external thread.

Optionally, the at least one connection rod is a tubular structure, an opening is defined in a junction of the clamping member and one end of the tubular structure; at least one data cable extends through the tubular structure; a first port of the data cable extends to an outside through the opening and a second port of the data cable extends to an outside of another end of the tubular structure.

According to a second aspect of the present disclosure, a display device is provided and includes a display device and a connection plate assembly. The connection plate assembly includes at least one connection plate and a clamp. The clamp detachably attaches the connection plate to a lateral side of the display device except for a light emitting side of the display device.

Optionally, the display device has a first lateral side, a second lateral side and a third lateral side; the first lateral side and the third lateral side are two opposite lateral sides of the display device; the second lateral side is adjacent to both of the first lateral side and the third lateral side. The clamp includes a clamping member clamps the first lateral side and the third lateral side; the clamping member includes a first clamping portion and a second clamping portion, and the first clamping portion and the second clamping portion are at two opposite sides of the clamping member. The first clamping portion is in contact with the first lateral side, the second clamping portion is in contact with the third lateral side, and the at least one connection plate is located at the second lateral side.

Optionally, the first lateral side is a top surface that is perpendicular to the light emitting side; the third lateral side is a bottom surface that is perpendicular to the light emitting side; and the second lateral side is perpendicular to the light emitting side, between the first lateral side and the third lateral side, and is connected with both of the first lateral side and the third lateral side.

Optionally, the clamping member further includes an adjustment member configured to adjust a distance between the first clamping portion and the second clamping portion. The adjustment member includes a tube and a spring within the tube; and two ends of the spring are connected with the first clamping portion and the second clamping portion, respectively. The tube is connected with one of the first clamping portion and the second clamping portion.

Optionally, the clamp further includes at least one connection rod that is connected with the clamping member, and each connection rod is mounted with at least one connection plate.

Optionally, an axis of the connection rod is substantially perpendicular to an axis of the tube; the connection rod is rotatably connected to the tube in such a manner that the connection rod is capable of rotating relative to the tube around the axis of the tube; the connection plate is rotatably connected to the connection rod in such a manner that the connection plate is capable of rotating relative to the connection rod around the axis of the connection rod.

DETAILED DESCRIPTION

The technical solutions of the present disclosure will be described hereinafter in a clear and complete manner in conjunction with the drawings of embodiments the present disclosure. Obviously, the following embodiments are merely a part of, rather than all of, the embodiments of the present disclosure, and based on these embodiments, a person skilled in the art may obtain the other embodiments, which also fall within the scope of the present disclosure.

As shown in FIG. 1 to FIG. 7, a connection plate assembly according to an embodiment of the present disclosure is provided and may be attached to a lateral side of a display device 10. The connection plate assembly includes at least one connection plate 1 and a clamp. The clamp is configured to detachably attach the connection plate 1 to a lateral side of a display device 10 except for a light emitting side 11 of the display device 10.

The connection plate 1 is attached to one lateral side of the display device 10 except for the light emitting side 11 of the display device 10, and may be used to record information or holding things. Further, since the connection plate 1 is attached by the clamp to one lateral side of the display device 10 rather than an edge of the light emitting side 11 of the display device 10, the attachment of the connection plate 1 is not limited by a frame of the display device 10. Then, the connection plate assembly may be applied to the display device 10 with a narrow frame or no frame, thereby expanding the application scope of the connection plate assembly and providing convenience for people's daily life. The light emitting side 11 refers to one side of the display device 10, where the one side of the display device 10 displays images.

Figure 5:
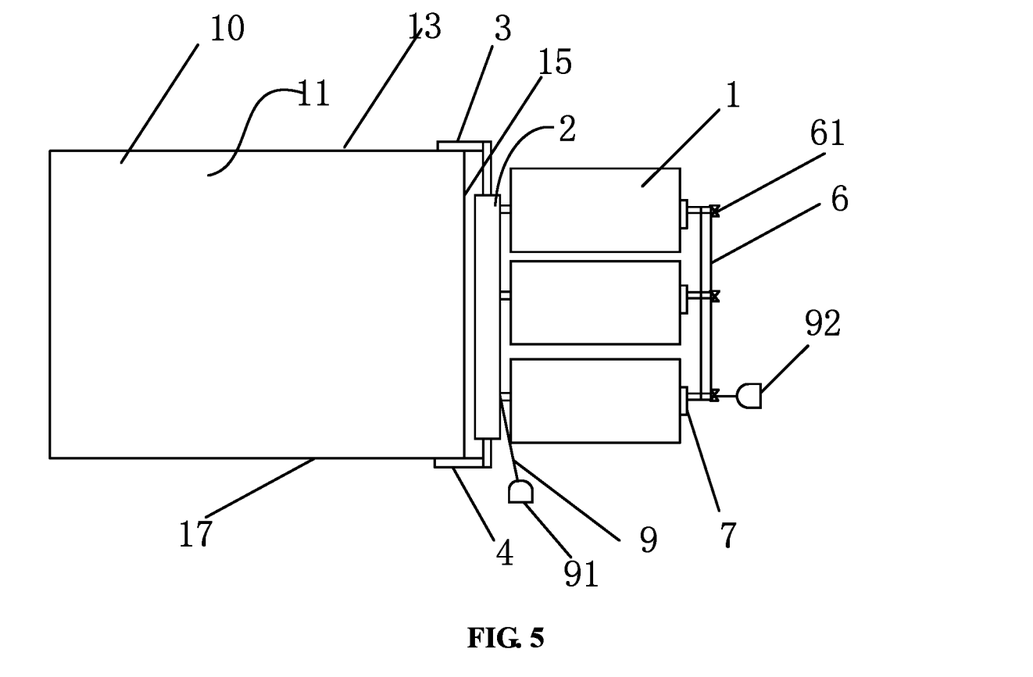
FIG. 5 is a schematic view showing a first usage state of the connection plate assembly when the connection plate assembly is applied to a display device according to an embodiment of the present disclosure.

The clamp may be in a variety of forms, as long as it can attach the connection plate 1 to the lateral side of the display device 10. In one embodiment, as shown in FIG. 5, the display device 10 has a first lateral side 13, a second lateral side 15 and a third lateral side 17. The first lateral side 13 and the third lateral side 17 are two opposite lateral sides of the display device 10. The second lateral side 15 is adjacent to both of the first lateral side 13 and the third lateral side 17.

In one embodiment, when the display device 10 is at a position shown in FIG. 5, the light emitting side 11 is a surface that is parallel to a paper surface. The first lateral side 13 is a top surface that is perpendicular to the paper surface. The second lateral side 15 is a right surface that is perpendicular to the paper surface. The third lateral side 17 is a bottom surface that is perpendicular to the paper surface.

The clamp includes a clamping member configured to clamp the first lateral side 13 and the third lateral side 17. The clamping member includes a first clamping portion 3 and a second clamping portion 4. The first clamping portion 3 and the second clamping portion 4 are at two opposite sides of the clamping member. When the clamping member clamps the display device 10, the first clamping portion 3 is in contact with the first lateral side 13, the second clamping portion 4 is in contact with the third lateral side 17, and at least one connection plate 1 is located at the second lateral side 15 of the display device 10.

In one embodiment, the connection plate 1 may be made of plastic or metal, but not limited to this.

Figure 3:
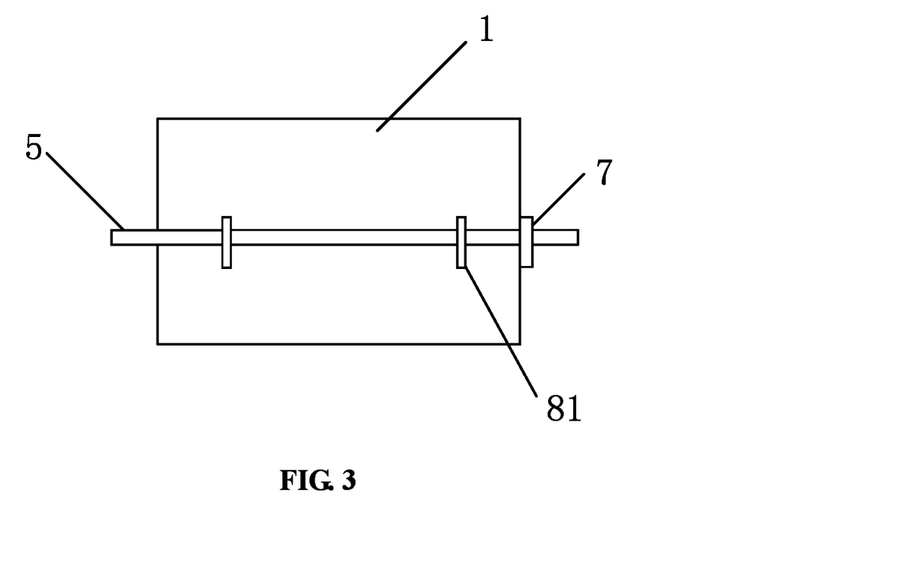
FIG. 3 is a schematic view showing a first connection state of a connection rod and a connection plate according to an embodiment of the present disclosure.
Figure 4:
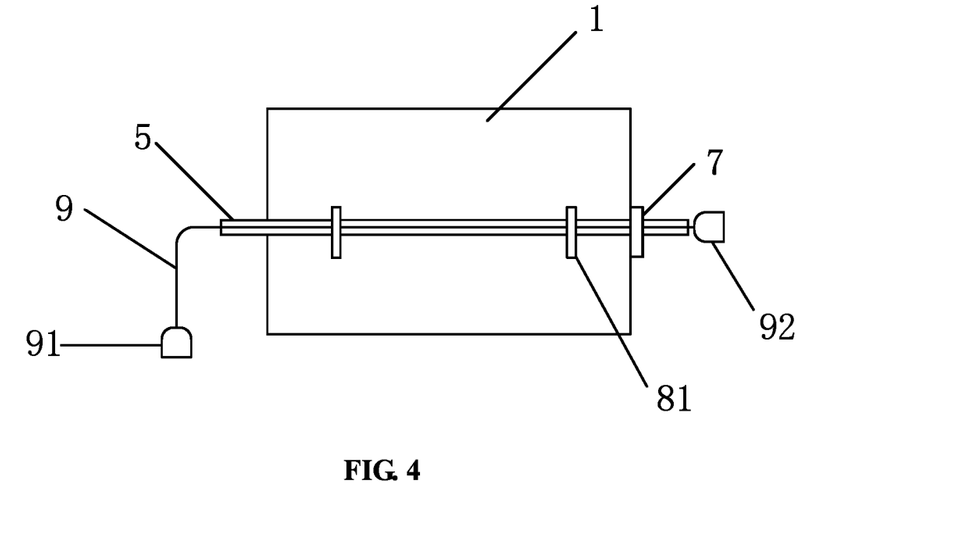
FIG. 4 is a schematic view showing a second connection state of a connection rod and a connection plate according to an embodiment of the present disclosure.

In one embodiment as shown in FIG. 3 to FIG. 5, the connection plate 1 is attached to the display device 10 by means of clamping in such a manner that the first clamping portion 3 is in contact with the first lateral side 13 and the second clamping portion 4 is in contact with the third lateral side 17, thus, an arrangement of the clamp is not limited by the frame of the display device 10, thereby expanding the application scope of the connection plate assembly.

Figure 10:
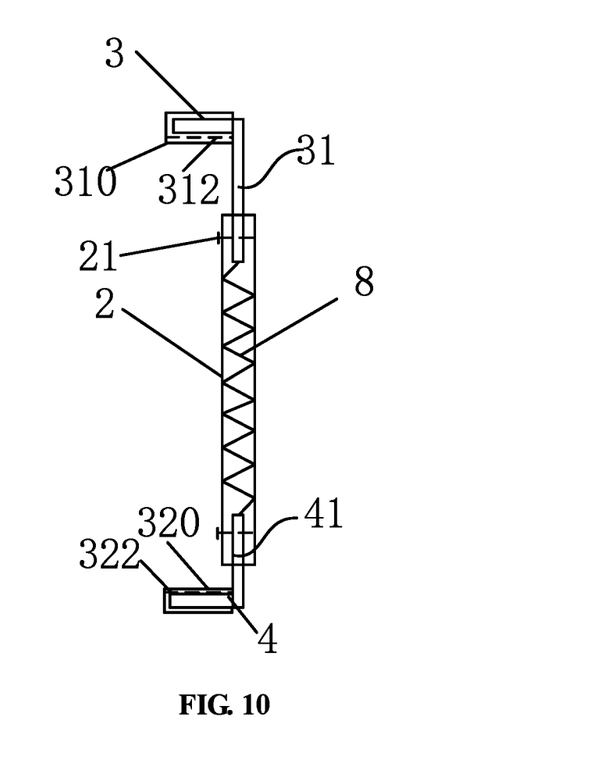
FIG. 10 is a schematic view of a clamp according to an embodiment of the present disclosure.

In one embodiment as shown in FIG. 10, a first elastic protection portion 310 is disposed at one side of the first clamping portion 3 facing the second clamping portion 4, and a second elastic protection portion 320 is disposed at one side of the second clamping portion 4 facing the first clamping portion 3. The presence of the first elastic protection portion 310 and the second elastic protection portion 320 can prevent the display device 10 from being damaged caused by large clamping force applied by the clamping member or relative movement between the clamping member and the display device 10. The presence of the first elastic protection portion 310 and the second elastic protection portion 320 can further prevent the clamping member from detaching from the display device 10 caused by the relative movement between the clamping member and the display device 10.

The first elastic protection portion 310 and the second elastic protection portion 320 may be in a variety of forms. In one embodiment, an elastic cushion may be disposed at one side of the first clamping portion 3 facing the second clamping portion 4, thereby forming the first elastic protection portion. An elastic cushion may be disposed at one side of the second clamping portion 4 facing the first clamping portion 3, thereby forming the second elastic protection portion.

In another embodiment of the present disclosure, a first elastic protection structure is sleeved on the first clamping portion 3, and one part of the first elastic protection structure at one side of the first clamping portion 3 facing the second clamping portion 4 forms the first elastic protection portion. A second elastic protection structure is sleeved on the second clamping portion 4, and one part of the second elastic protection structure at one side of the second clamping portion 4 facing the first clamping portion 3 forms the second elastic protection portion.

Each of the first elastic protection structure and the second elastic protection structure is an elastic protection sleeve, and one corresponding part of the elastic protection sleeve forms the first elastic protection portion or the second elastic protection portion.

The presence of the elastic protection sleeves can play a role of anti-skid and protection. Further, the connection between the elastic protection sleeve and each of the first clamping portion 3 and the second clamping portion 4 is stable.

A groove 312 is defined in one surface of the first elastic protection portion facing the second elastic protection portion. A groove 322 is defined in one surface of the second elastic protection portion facing the first elastic protection portion.

The presence of the grooves 312 and 322 can provide adsorption function for the clamping member when the clamping member clamps the display device 10, thereby ensuring stability of the connection between the clamping member and the display device 10.

The grooves may be in a variety of forms, such as strip-shaped grooves or hemispherical grooves. The grooves may be in other forms as long as the grooves can realize anti-skid function, protect the display device and the clamping member, and provide adsorption function for the clamping member when the clamping member clamps the display device so as to enhance strength of the connection between the clamping member and the display device.

The first elastic protection portion and the second elastic protection portion may be made of rubber, but not limited to this.

Sizes of the display devices 10 may be varied, and thus a distance between the first lateral side and the third lateral side may be varied. In one embodiment, the clamping member further includes an adjustment member configured to adjust a distance between the first clamping portion 3 and the second clamping portion 4. The distance between the first clamping portion 3 and the second clamping portion 4 may be adjusted according to sizes of the display devices, so that the clamping member can be applied to the display devices of different sizes, thereby expanding the application scope of the connection plate assembly.

Figure 1:
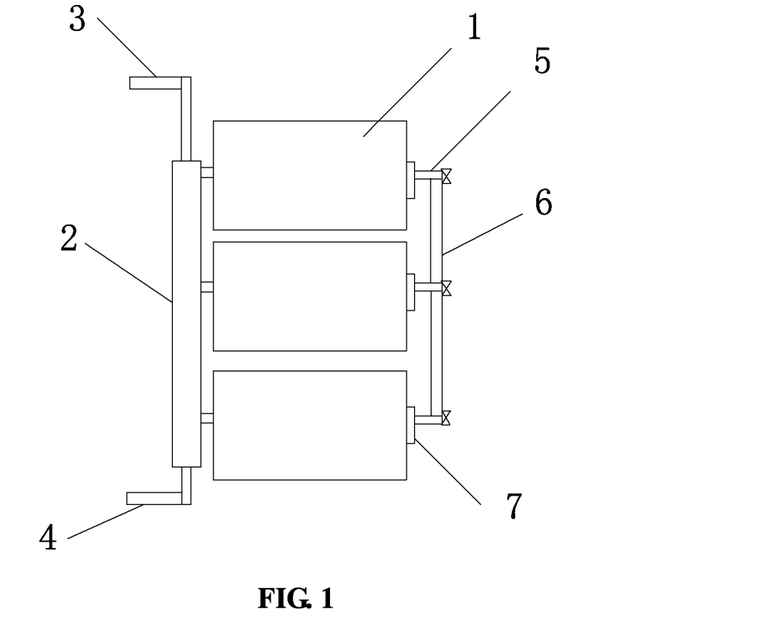
FIG. 1 is a schematic view of a connection plate assembly according to an embodiment of the present disclosure.
Figure 2:
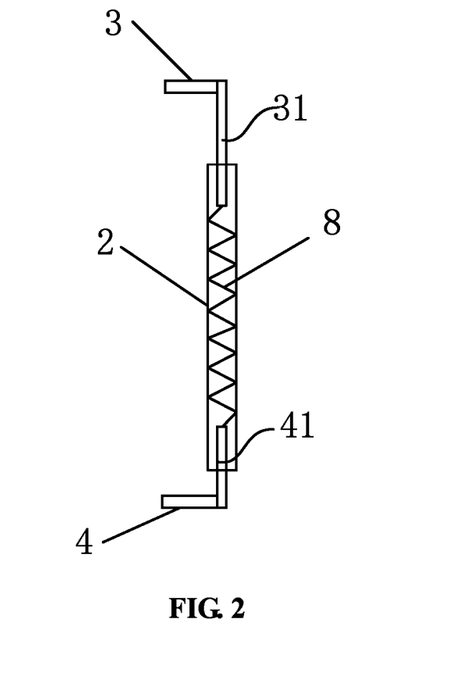
FIG. 2 is a schematic view of a clamp according to an embodiment of the present disclosure.

The adjustment member may be of a variety of forms, as long as the distance between the first clamping portion 3 and the second clamping portion 4 is adjustable. In one embodiment, as shown in FIG. 2, the adjustment member includes a tube 2 and a spring 8 within the tube 2. Two ends of the spring 8 are connected with the first clamping portion 3 and the second clamping portion 4, respectively. The tube 2 protects the spring 8. The first clamping portion 3 includes a first connection portion 31 that is parallel to the tube 2, and at least one part of the first connection portion 31 extends into the tube 2. The second clamping portion 4 includes a second connection portion 41 that is parallel to the tube 2, and at least one part of the second connection portion 41 extends into the tube 2. In order to prevent the spring 8 from escaping from the tube 2 when the distance between the first clamping portion 3 and the second clamping portion 4 are increased, the tube 2 may be connected with one of the first clamping portion 3 and the second clamping portion 4. For example, as shown in FIG. 10, the tube 2 may be connected with one of the first clamping portion 3 and the second clamping portion 4 by means of a pin or screw 21. In the embodiment shown in FIG. 10, each of the first clamping portion 3 and the second clamping portion 4 is substantially L-shaped.

The tube 2 may be parallel to the second lateral side 15, so that when the connection plate assembly is attached to the display device 10, the first clamping portion 3 is in contact with the first lateral side 13 and the second clamping portion 4 is in contact with the third lateral side 17. Further, under the elastic force of the spring 8, the first clamping portion 3 and the second clamping portion 4 cooperate to firmly attach the connection plate assembly to the display device 10. When the spring 8 is not deformed, the distance between the first clamping portion 3 and the second clamping portion 4 is referred to as a first distance. When the spring 8 has the greatest deformation, the distance between the first clamping portion 3 and the second clamping portion 4 is referred to as a second distance. As long as the distance between the first lateral side 13 and the third lateral side 17 of one display device is greater than or equal to the first distance and is less than or equal to the second distance, the connection plate assembly can be applied to the one display device.

In one embodiment, the tube 2, each of the first clamping portion 3 and the second clamping portion 4 may be made of metal, thereby ensuring the connection strength of the clamp.

In one embodiment, the clamp further includes at least one connection rod 5 that is connected with the clamping member. Each connection rod 5 is mounted with at least one connection plate 1.

The number of the connection rod 5 and the number of connection plate 1 mounted on each connection rod 5 may be set according to actual needs. In one embodiment as shown in FIG. 6, there are three connection rods 5 that are substantially parallel to the tube 2 and each connection rod 5 is mounted with one connection plate 1.

Figure 6:
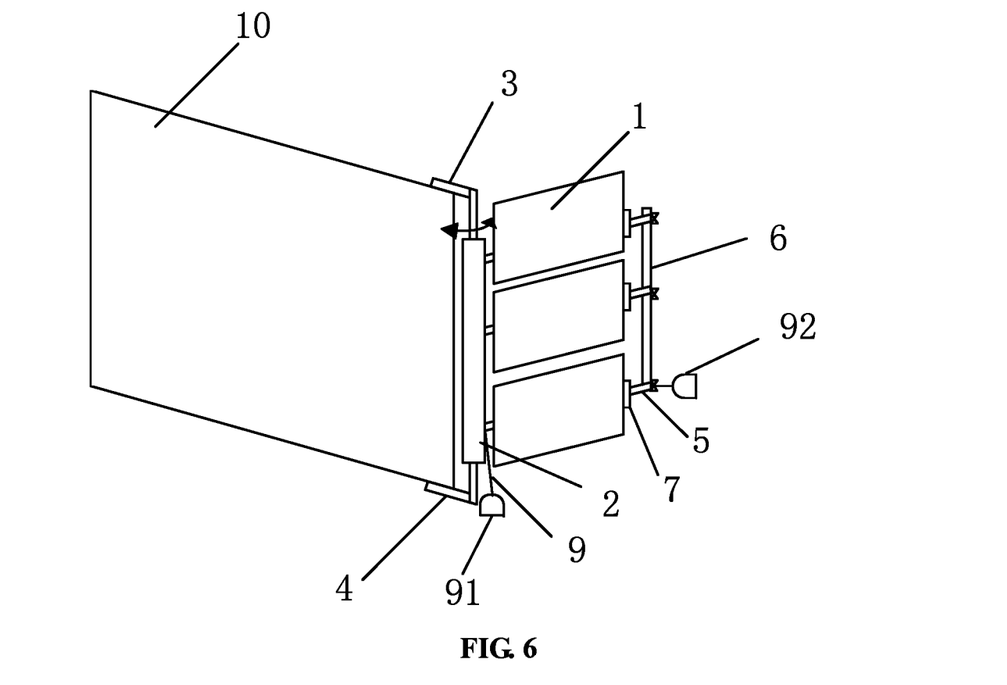
FIG. 6 is a schematic view showing a second usage state of the connection plate assembly when the connection plate assembly is applied to a display device according to an embodiment of the present disclosure.
Figure 7:
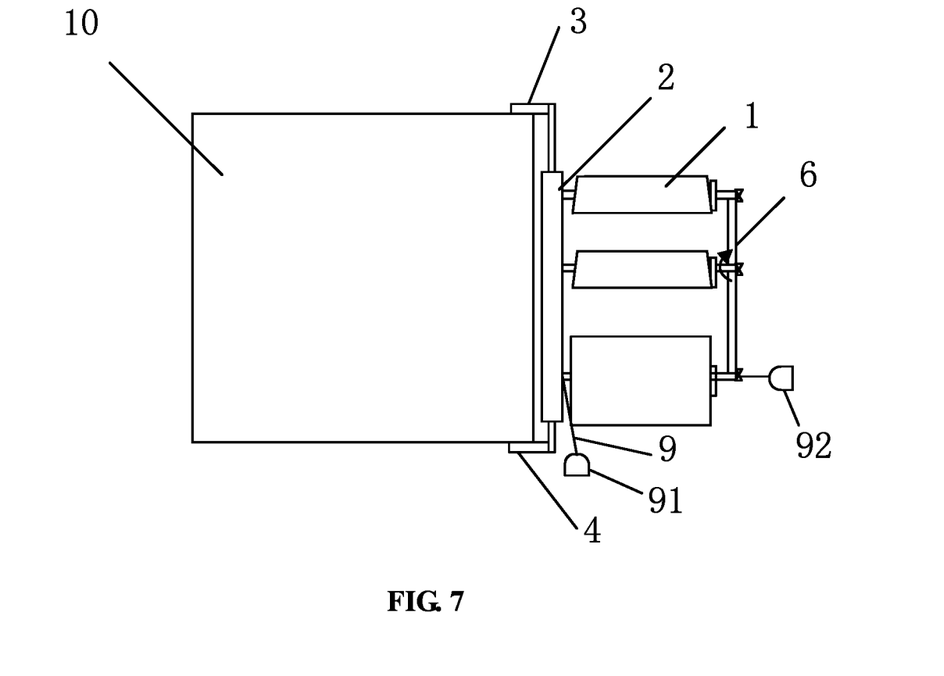
FIG. 7 is a schematic view showing a third usage state of the connection plate assembly when the connection plate assembly is applied to a display device according to an embodiment of the present disclosure.

When the display device 10 is at a position shown in FIG. 5 to FIG. 7, the connection rods 5 are substantially horizontally disposed, and the connection rods 5 can rotate around the clamping member in the horizontal plane. For example, the connection rods 5 can rotate relative to the display device 10 around an axis of the tube 2 in a direction indicated by an arrow shown in FIG. 6. The presence of the rotatable connection rods 5 facilitates usage of the connection plate assembly, for example, the connection plate 1 may be rotated by a desired angle.

For example, FIG. 5 shows a first usage state of the connection plate assembly when the connection plate assembly is applied to the display device 10. In the first usage state, the connection rods 5 are parallel to a plane where a screen of the display device 10 is, and the connection plate 1 is located at one lateral side of the display device 10.

FIG. 6 shows a second usage state of the connection plate assembly when the connection plate assembly is applied to the display device 10. In the second usage state, the connection rods 5 are rotated toward a back of the display device 10 until the connection plate 1 is behind the display device 10, thereby reducing space (which is around the display device and adjacent a user in front of the display device) occupied by the connection plate assembly and then facilitating usage. The connection rods 5 have a maximum rotation angle close to 180 degrees, but not limited to this.

In one embodiment, the connection rods 5 may be made of plastic, but not limited to this.

Figure 8:
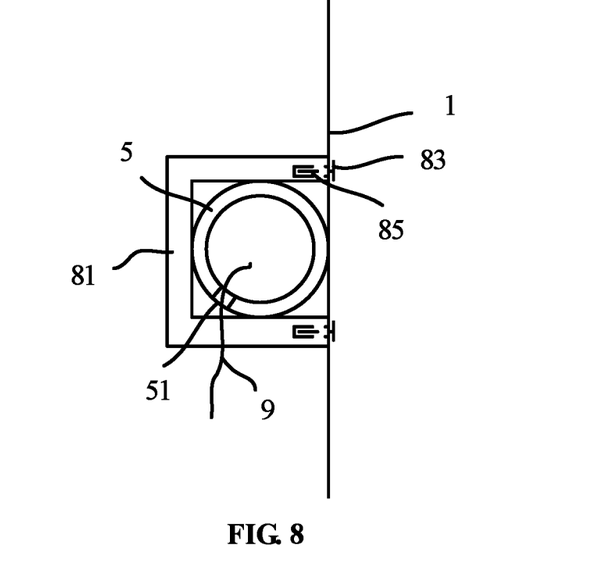
FIG. 8 is a schematic view showing a connection relationship between the connection rod and a U-shaped connection piece.
Figure 9:
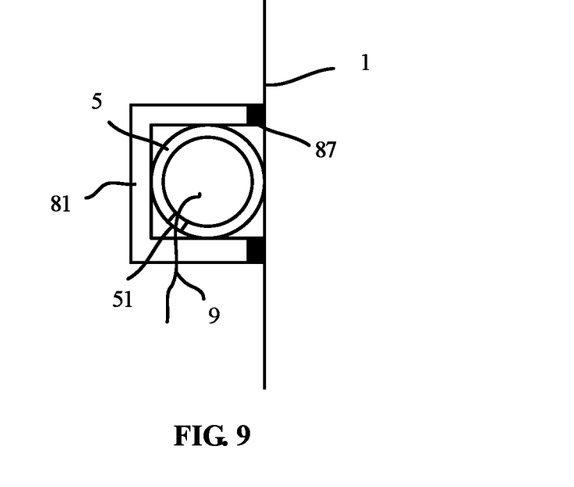
FIG. 9 is a schematic view showing a connection relationship between the connection rod and a U-shaped connection piece.

In one embodiment, the connection plate 1 is rotatable connected to the connection rod 5 by means of a U-shaped connector 81. The connection rod 5 extends through the U-shaped connector 81. A fixing portion is provided at each of two ends of the U-shaped connector 81. A through hole 85 (as shown in FIG. 8) is defined through the fixing portion for a screw 83 extending therethrough. Alternatively, an adhesive layer 87 (as shown in FIG. 9) may be provided at the fixing portion.

In one embodiment, an adjustment piece is disposed on an end of the connection rod 5 away from the clamping member. The adjustment piece is configured to adjust a rotation angle of the connection plate 1.

Since the connection plate 1 is rotatable mounted to the connection rod 5, users may change functions of the connection plate 1 according to their needs. Further, the connection plate 1 may be rotated by a desired angle to a position and is fixed to this position by means of the adjustment piece, thereby facilitating usage of the connection plate 1 with one function associated with this position.

For example, as shown in FIG. 5, the connection plate 1 is parallel to the plane where the screen of the display device 10 is, then information may be recorded in the connection plate 1 (i.e., directly writing on the connection plate 1, or sticking a notepaper, a photograph, a picture or the like on the connection plate 1).

For another example, as shown in FIG. 7, the connection plate 1 may be rotated around the connection rod 5 to be substantially perpendicular to the plane where the screen is, and then things may be placed on the connection plate 1.

When the connection plate assembly includes several connection plates 1, some of the connection plates 1 (i.e., the connection plate 1 at the bottom shown in FIG. 7) may be substantially parallel to the plane where the screen is, and some of the connection plates 1 (i.e., the top two connection plates 1 shown in FIG. 7) may be substantially perpendicular to the plane where the screen is. In other words, in the same connection plate assembly, the connection plates 1 may be used with different functions.

The adjustment piece may be of a variety of forms, as long as the rotation angle of the connection plate 1 can be adjusted. For example, as shown in FIG. 5 and FIG. 6, an external thread is provided at an outer circumferential surface of the end of the connection rod 5 away from the clamping member, and then the adjustment piece may be an adjustment screw 7 that engages with the external thread.

In one embodiment, when there are at least two connection rods 5, ends of the connection rods 5 away from the clamping member may be fixed to a fixing rod 6.

The presence of the fixing rod 6 enhances the connection stability of the connection plate assembly.

The connection rods 5 may be connected to the fixing rod 6 by means of screws 61. When one screw 61 is removed away, then the corresponding connection plate 1 can be removed, thereby facilitating the dismantling and maintenance of the connection plate 1.

The connection plate assembly of one embodiment of the present disclosure solves the problems that in daily official work, there is no fixed storage place for temporary notepapers and desktop space is compact with less space to place a U disk, a mobile phone and commonly used stationery. Further, the connection plate assembly can also be used to record temporary information, i.e., writing directly on the board, thereby solving the problem that the temporary information cannot be found during meetings.

The connection plate assembly of one embodiment of the present disclosure may be applied to various displace devices such as televisions, liquid crystal display devices, notebook computers and tablet computer with different widths.

In one embodiment of the present disclosure, at least one connection rod 5 is a tubular structure. An opening 51 is defined in a junction of the clamping member and one end of the tubular structure. At least one data cable 9 extends through the tubular structure. A first port 91 of the data cable 9 extends to an outside through the opening 51, and a second port 92 of the data cable 9 extends to the outside of the tubular structure.

In one embodiment, each of the connection rods 5 is a tubular structure and each connection rod 5 is provided with one data cable. In other embodiment, some of the connection rods 5 are tubular structures and are provided with data cables. The specific arrangement may be set according to actual needs.

FIG. 3 shows a first connection state of the connection rod 5 and the connection plate according to an embodiment of the present disclosure. In the first connection state, no data cable 9 is disposed in the connection rod 5. FIG. 4 shows a second connection state of the connection rod 5 and the connection plate according to an embodiment of the present disclosure. In the second connection state, one data cable 9 is disposed in one connection rod 5. When there are two or more connection rods 5, at least one of the connection rods 5 is a tubular structure with one data cable 9 extending therethrough. As shown in FIG. 5 to FIG. 7, the connection plate assembly has three connection rods 5, the connection rod 5 at the bottom (when the display device 10 is at a position shown in FIG. 5 to FIG. 7) is provided with one data cable 9. The presence of the data cable 9 provides better usability for users.

The first port 91 may be coupled to an electronic device or a power adapter. The second port 92 may be coupled to an electronic device or a power adapter. The presence of the data cable 9 can realize data transportation between electronic devices or charge the electronic device. One electronic device coupled with the data cable 9 may be placed on the connection plate, thereby saving space and providing better usability for users.

The first port 91 and the second port 92 of the data cable 9 may be universal serial bus (USB) interfaces, but not limited to this. Types of the USB interfaces may be type-A, type-B or type-C.

In one embodiment, one end of the data cable 9 extending to the outside through the opening has at least one first port 91. When one end of the data cable 9 has two or more first ports 91, the first ports 91 are USB interfaces of different types. Another end of the data cable 9 extending to the outside of the tubular structure has at least one second port

92. When one end of the data cable 9 has two or more second ports 92, the second ports 92 are USB interfaces of different types.

One embodiment of the present disclosure further provides a display device including the above connection plate assembly.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A connection plate assembly comprising:
   at least one connection plate; and
   a clamp;
   wherein the clamp is configured to detachably attach the connection plate to a lateral side of a display device except for a light emitting side of the display device;
   wherein the display device includes a first lateral side, a second lateral side and a third lateral side; the first lateral side and the third lateral side are two opposite lateral sides of the display device; the second lateral side is adjacent to both of the first lateral side and the third lateral side;
   wherein the clamp includes a clamping member configured to clamp the first lateral side and the third lateral side; the clamping member includes a first clamping portion and a second clamping portion, and the first clamping portion and the second clamping portion are at two opposite sides of the clamping member; and
   wherein the first clamping portion and the second clamping portion are configured to, when the clamping member clamps the display device, the first clamping portion is in contact with the first lateral side and the second clamping portion is in contact with the third lateral side, so that the at least one connection plate is located at the second lateral side;
   wherein a first elastic protection portion is disposed at one side of the first clamping portion facing the second clamping portion, and a second elastic protection portion is disposed at one side of the second clamping portion facing the first clamping portion;
   wherein a first elastic protection structure is sleeved on the first clamping portion, and one part of the first elastic protection structure at the one side of the first clamping portion facing the second clamping portion defines the first elastic protection portion; a second elastic protection structure is sleeved on the second clamping portion, and one part of the second elastic protection structure at the one side of the second clamping portion facing the first clamping portion defines the second elastic protection portion;
   wherein the clamping member further includes an adjustment member configured to adjust a distance between the first clamping portion and the second clamping portion; and
   wherein the adjustment member includes a tube and a spring within the tube, and two ends of the spring are connected with the first clamping portion and the second clamping portion, respectively.

2. The connection plate assembly of claim 1, wherein a groove is defined in one surface of the first elastic protection portion facing the second elastic protection portion; and a groove is defined in one surface of the second elastic protection portion facing the first elastic protection portion.

3. The connection plate assembly of claim 1, wherein the first elastic protection portion and the second elastic protection portion are made of rubber.

4. A connection plate assembly comprising:
   at least one connection plate; and
   a clamp;
   wherein the clamp is configured to detachably attach the connection plate to a lateral side of a display device except for a light emitting side of the display device;
   wherein the display device includes a first lateral side, a second lateral side and a third lateral side; the first lateral side and the third lateral side are two opposite lateral sides of the display device; the second lateral side is adjacent to both of the first lateral side and the third lateral side;
   wherein the clamp includes a clamping member configured to clamp the first lateral side and the third lateral side; the clamping member includes a first clamping portion and a second clamping portion, and the first clamping portion and the second clamping portion are at two opposite sides of the clamping member; and
   wherein the first clamping portion and the second clamping portion are configured to, when the clamping member clamps the display device, the first clamping portion is in contact with the first lateral side and the second clamping portion is in contact with the third lateral side, so that the at least one connection plate is located at the second lateral side;
   wherein the clamp further includes at least one connection rod that is connected with the clamping member, and the connection rod is mounted with at least one connection plate;
   wherein the connection rod is substantially horizontally disposed, and the connection rod is configured to rotate around the clamping member in the horizontal plane;
   wherein the connection plate is rotatable connected to the connection rod by a U-shaped connector; the connection rod extends through the U-shaped connector; a fixing portion is provided at each of two ends of the U-shaped connector; a through hole is defined through each of the fixing portions for mounting a screw or an adhesive layer is at each of the fixing portions.

5. The connection plate assembly of claim 4, wherein an adjustment piece is on an end of the connection rod away from the clamping member, and the adjustment piece is configured to adjust a rotation angle of the connection plate.

6. The connection plate assembly of claim 5, wherein an external thread is provided at an outer circumferential surface of the end of the connection rod away from the clamping member, and the adjustment piece is an adjustment screw that engages with the external thread.

7. The connection plate assembly of claim 4, wherein the at least one connection rod is a tubular structure, an opening is defined in a junction of the clamping member and one end of the tubular structure; at least one data cable extends through the tubular structure; a first port of the data cable extends to an outside through the opening and a second port of the data cable extends to an outside of another end of the tubular structure.

8. A display device comprising:
   a display device; and
   a connection plate assembly;
   wherein the connection plate assembly includes:
   at least one connection plate; and
   a clamp;

wherein the clamp detachably attaches the connection plate to a lateral side of the display device except for a light emitting side of the display device;

wherein the display device includes a first lateral side, a second lateral side and a third lateral side; the first lateral side and the third lateral side are two opposite lateral sides of the display device; the second lateral side is adjacent to both of the first lateral side and the third lateral side;

wherein the clamp includes a clamping member clamps the first lateral side and the third lateral side; the clamping member includes a first clamping portion and a second clamping portion, and the first clamping portion and the second clamping portion are at two opposite sides of the clamping member; and wherein the first clamping portion is in contact with the first lateral side, the second clamping portion is in contact with the third lateral side, and the at least one connection plate is located at the second lateral side;

wherein a first elastic protection portion is disposed at one side of the first clamping portion facing the second clamping portion, and a second elastic protection portion is disposed at one side of the second clamping portion facing the first clamping portion;

wherein a first elastic protection structure is sleeved on the first clamping portion, and one part of the first elastic protection structure at the one side of the first clamping portion facing the second clamping portion defines the first elastic protection portion; a second elastic protection structure is sleeved on the second clamping portion, and one part of the second elastic protection structure at the one side of the second clamping portion facing the first clamping portion defines the second elastic protection portion;

wherein the clamping member further includes an adjustment member configured to adjust a distance between the first clamping portion and the second clamping portion;

wherein the adjustment member includes a tube and a spring within the tube; and two ends of the spring are connected with the first clamping portion and the second clamping portion, respectively; and wherein the tube is connected with one of the first clamping portion and the second clamping portion.

9. The display device of claim 8, wherein the first lateral side is a top surface that is perpendicular to the light emitting side; the third lateral side is a bottom surface that is perpendicular to the light emitting side; and the second lateral side is perpendicular to the light emitting side, between the first lateral side and the third lateral side, and is connected with both of the first lateral side and the third lateral side.

10. The display device of claim 8, wherein the clamp further includes at least one connection rod that is connected with the clamping member, and the connection rod is mounted with at least one connection plate.

11. The display device of claim 10, wherein an axis of the connection rod is substantially perpendicular to an axis of the tube; the connection rod is rotatably connected to the tube in such a manner that the connection rod is capable of rotating relative to the tube around the axis of the tube; the connection plate is rotatably connected to the connection rod in such a manner that the connection plate is capable of rotating relative to the connection rod around the axis of the connection rod.

\* \* \* \* \*